United States Patent [19]
Esherick et al.

[11] Patent Number: 5,054,028
[45] Date of Patent: Oct. 1, 1991

[54] FEEDBACK STABILIZATION SYSTEM FOR PULSED SINGLE LONGITUDINAL MODE TUNABLE LASERS

[75] Inventors: Peter Esherick; Thomas D. Raymond, both of Albuquerque, N. Mex.

[73] Assignee: The United States of America as represented by the United States Department of Energy, Washington, D.C.

[21] Appl. No.: 340,823

[22] Filed: Apr. 20, 1989

[51] Int. Cl.$^5$ ............................................... H01S 3/137
[52] U.S. Cl. ........................................ 372/32; 372/102
[58] Field of Search ..................... 372/29, 31, 38, 32, 372/92, 102

[56] References Cited

U.S. PATENT DOCUMENTS

| | | | |
|---|---|---|---|
| 3,899,748 | 8/1975 | Bodlaj | 331/94.5 S |
| 4,103,254 | 7/1978 | Chikami | 372/32 |
| 4,434,490 | 2/1984 | Kavaya et al. | 372/20 |
| 4,502,144 | 2/1985 | Suhre | 372/23 |
| 4,513,422 | 4/1985 | Buholz | 372/29 |
| 4,559,500 | 12/1985 | McDermid et al. | 330/4.3 |
| 4,592,058 | 5/1986 | Mongeon et al. | 372/32 |
| 4,660,206 | 4/1987 | Halmos et al. | 372/28 |
| 4,672,618 | 6/1987 | Wijntjes et al. | 372/32 |
| 4,674,097 | 6/1987 | Fountain | 372/54 |
| 4,700,352 | 10/1987 | Shikada et al. | 372/20 |

OTHER PUBLICATIONS

M. Littman, "Single-Mode Pulsed Tunable Dye Laser", *Applied Optics*, vol. 23, No. 24, Dec. 15, 1984, pp. 4465–4468.

K. Liu et al., "Novel Geometry for Single-Mode Scanning of Tunable Laser", *Optics Letters*, vol. 6, No. 3, Mar. 1981, pp. 117–118.

A. Owyoung et al., "Stress-Induced Tuning of a Diode-Laser-Excited Monolithic Nd:YAG Laser", *Optics Letters*, vol. 12, No. 12, pp. 999–1001, Dec. 1987.

T. Raymond et al., "Cavity-Mode Stabilization of a Grazing-Induced Pulsed Dye Laser", Conference on Lasers & Electro-Optics, 4/88.

*Primary Examiner*—Frank Gonzalez
*Attorney, Agent, or Firm*—Karla Ojanen; James H. Chafin; William R. Moser

[57] ABSTRACT

A feedback stabilization system for pulse single longitudinal mode tunable lasers having an excited laser medium contained within an adjustable length cavity and producing a laser beam through the use of an internal dispersive element, including detection of angular deviation in the output laser beam resulting from detuning between the cavity mode frequency and the passband of the internal dispersive element, and generating an error signal based thereon. The error signal can be integrated and amplified and then applied as a correcting signal to a piezoelectric transducer mounted on a mirror of the laser cavity for controlling the cavity length.

11 Claims, 1 Drawing Sheet

FEEDBACK STABILIZATION SYSTEM FOR PULSED SINGLE LONGITUDINAL MODE TUNABLE LASERS

BACKGROUND OF THE INVENTION

The present invention is directed to a feedback stabilization system for pulsed single-frequency tunable lasers. The U.S. Government has rights in this invention pursuant to Contract No. DE-AC04-79DP00789 between the Department of Energy and AT&T Technologies, Inc.

There has been a long need for a broadly scannable, narrow bandwidth pulsed laser source for spectroscopic use. Prior to the present invention, the only viable method of generating high-intensity, narrow bandwidth coherent light has been to pulse-amplify single longitudinal mode continuous wave (cw) dye lasers. These tunable cw sources, pumped by cw ion lasers, are expensive and bulky. Further, they cannot easily scan over even narrow frequency ranges. Significant cost, complexity, and space savings would be realized by the replacement of these cw laser sources with relatively simple pulsed, single-mode dye oscillators.

Compact, inexpensive, grating-tuned single-mode oscillators of the type first described by Littman have been demonstrated to be scannable over tens of wave numbers. See Littman, "Single-mode pulsed tunable dye laser," Appl. Opt. 23, 4465 (1984). This approach uses a diffraction grating at grazing incidence as the frequency selective element that allows only a single longitudinal mode to oscillate in the laser cavity. Littman's mechanical design couples the scanning of the grating passband and frequency of the cavity modes in such a manner that the selected mode can be tuned continuously. This was described by Liu and Littman, "Novel geometry for single-mode scanning of tunable lasers," Opt. Lett. 6, 117 (1981). While this design is quite elegant in theory, the mechanical tolerances necessary for broad scan ranges cannot be obtained in practice.

SUMMARY OF THE INVENTION

It is an object of the present invention to provide a simple and inexpensive cavity control technique which significantly reduces the mechanical requirements and permits a very broad single mode scan range.

It is another object of the present invention to stabilize the optical cavity of a grating tuned oscillator, thereby permitting long-term single longitudinal mode operation and wider wavelength scan ranges than previously possible.

DETAILED DESCRIPTION OF THE INVENTION

Figure 1:
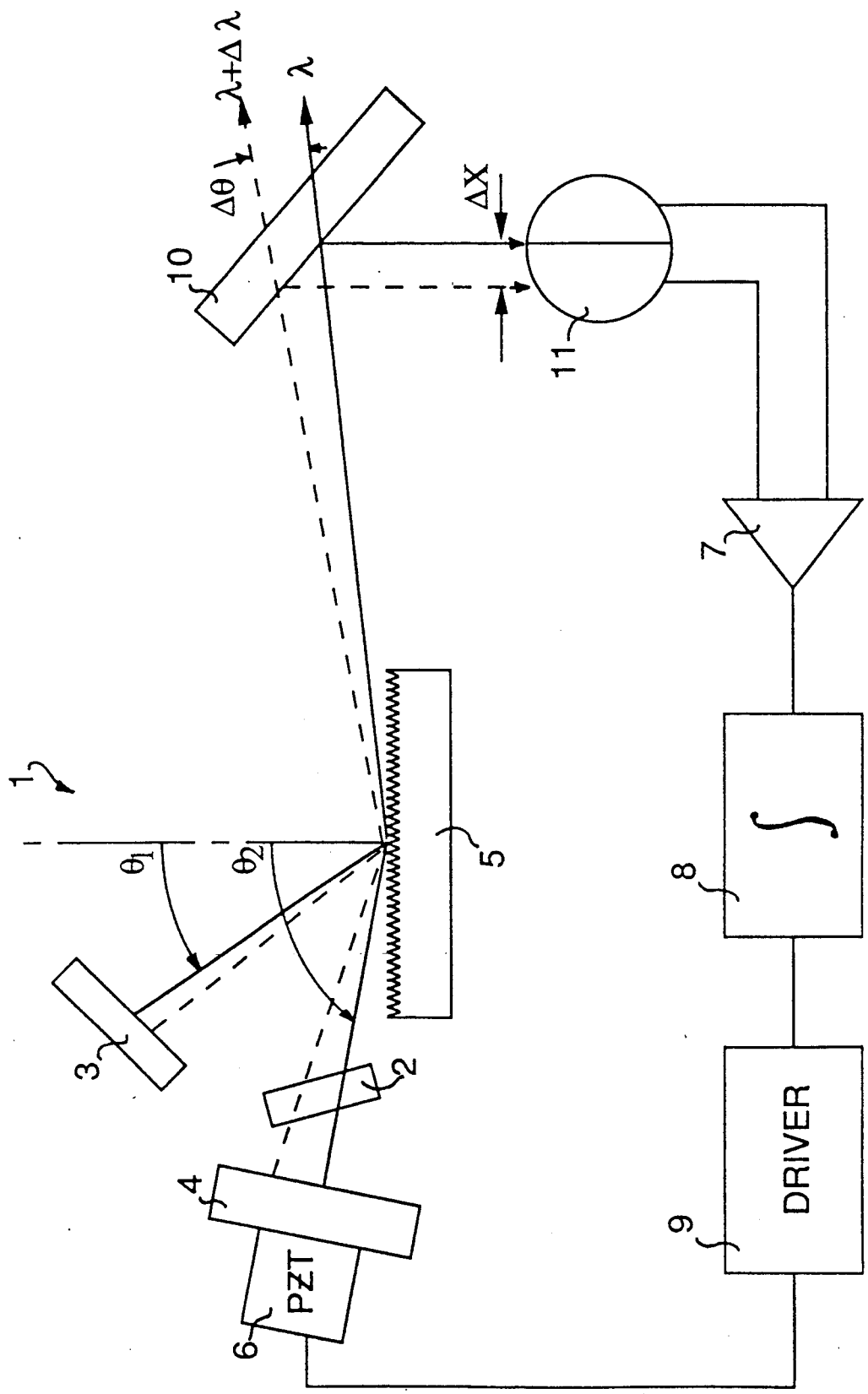
FIG. 1 is a schematic diagram of a laser cavity and includes a diagram of a circuit of the feedback stabilization system, according to the present invention.

The present invention achieves the above objectives by relying on the presence of a small, but detectable, angular variation in the output of a grating-tuned resonator representative of the detuning between the cavity-mode frequency and the grating passband. These angular variations can be sensed by a device, such as a split photodiode, which generates an error signal to be applied to a piezoelectric transducer (PZT) or other device to adjust the cavity length and correct the detuning error. With this arrangement, the cavity longitudinal mode frequency can be stabilized to the grating maximum so that the mechanical and alignment tolerances can be relaxed. In addition, cavity-length changes resulting from external perturbations and dispersion are automatically and continuously eliminated.

The present invention utilizes a detectable angular deviation of the laser's output beam which is a direct consequence of the use of a wavelength selective optical element in the laser cavity. Representative optical elements include diffraction gratings and etalons. The presence of the small, but detectable, angular variation in the output of the resonator is indicative of the detuning between the cavity-mode frequency and the grating passband. This deviation of the laser output beam is a direct consequence of the dispersion of the grating.

A specific cavity design which can be used in the present invention follows the Littman design with the addition of a piezoelectric transducer (PZT) on the rear mirror to permit fine adjustment of the cavity length. FIG. 1 shows such a representative cavity design.

The equation relating the resonant wavelength to the geometric angles of incidence is:

$$\lambda/d = \sin\Theta_1 + \sin\Theta_2 \qquad (1)$$

In equation (1), d represents the grating period divided by the diffraction order. The diffraction order can be 1. For any wavelength, $\lambda + \Delta\lambda$, different from the resonant wavelength $\lambda$, the beam will deviate at the angles $\Theta_1$ and $\Theta_2$ from the circulating path, as shown in FIG. 1. This angular deviation is then directly reflected in the direction of the output beam. Based on simple geometric optics, this angular deviation can be shown to be of order $\Delta\Theta \approx 2\Delta\lambda/(d \cos\Theta_2)$. The angular deviation of the laser output beam is most conveniently observed at a distance L from the laser as a linear displacement of the beam, $\Delta x = L\Delta\Theta$, where x is the deviation of the laser output beam transverse to the direction of propagation at distance L, and L represents the distance from the laser output (i.e., from the diffraction grating to the laser beam angular deviation sensor, e.g., a split photodiode).

As shown in FIG. 1, a laser cavity 1 includes a dye cell (DC) 2, two mirrors 3 and 4, and a diffraction grating 5. The rear mirror 4 has a PZT 6 mounted thereon for adjusting the length of of the cavity length. The optical component 5 can include a 2400 g/mm or 1800 g/mm holographic grating (PTR GI-2400 or GI-1800), a 2-mm path-length dye cell (Precision Cells #48), and $\lambda/20$ high-reflectivity mirrors (NRC BD.1). The grating and mirrors can be mounted with flexible silicone adhesive to minimize distortion to the optical surfaces. For proper single-longitudinal-mode operation, it is preferred that the net round-trip optical distortion in the cavity is less than $\lambda/4$. The wavelength scanning mechanism can comprise a precision rotation stage (Control Techniques Corporation Model 571-100) with a motorized micrometer and digital length gauge having 0.1 $\mu$m resolution (Heidenhain MT-12).

The laser's rigid invar base can be mounted via rubber pads in an aluminum enclosure to reduce air currents and vibration. In order to minimize frequency jitter due to thermally-induced variations in the index of refraction of the methanol, the dye can be passed through a tube filled with stainless steel ball bearings prior to flowing it through the dye cell.

The pump laser can be a spatially-filter, frequency-doubled, injection-seeded Nd:YAG laser (DCR-2A) operating at 10 Hz. Up to 1.1 mJ of pump radiation can be imaged to a spot of 0.3 mm diameter at the dye cell. Typically 1 to 10 μJ of single-longitudinal-mode output energy is generated. The amplitude and frequency stability of the laser is best when pumped by the single-longitudinal-mode output from the pump laser. However, it can be pumped by a multi-mode pump laser.

A sensor 11 for sensing a position or location (i.e., looking for transverse motion perpendicular to the direction of propagation of a light beam) can be used for detecting the linear displacement of the laser's output beam in the plane perpendicular to the grating grooves. Such sensitive position sensors can include a two-element photo diode, such as United Technologies model Spot-4 or EGG UV-140BQ-2. The sensor 11 can be located approximately 30 cm from the dye cell for sensing these angular deviations. This sensor 11 can be connected, as shown in FIG. 1, to a differential charge preamplifier 7 in a manner that permits comparison between the intensity striking on the left side of the detector to the intensity on the right side of the detector. Transverse movement of the intensity profile of the laser output is thus translated into a positive or negative going voltage pulse, depending upon the direction of movement of the beam, which is in turn dependent on the sign of the detuning of the grating laser cavity.

Feedback control of the cavity can be accomplished by signal averaging and integrating the preamplified photodetector error signal in a commercial gated integrator 8, such as a PAR Model 162/165, operating in its signal summing mode. The integrated (DC) error signal is then further amplified in a high-voltage driver circuit 9 and finally fed to the piezoelectric transducer 6 that controls the cavity length of the laser oscillator via translation of its rear mirror 4. Thus, in closed loop operation, a mis-tuning of the cavity length leads to a movement of the output beam that is detected by the split photodiode, thereby producing a signed error signal. This error signal is integrated and amplified and then converted into a correction of the cavity length by the piezoelectric transducer. The correction of the cavity length continues in proportion to the error signal until the error signal has been reduced to zero. With the feedback loop opened and the cavity length adjusted for optimal single-longitudinal-mode operation, the output beam is centered on the photodiode to produce a null error signal. The loop can be closed to continuously correct the cavity.

A conventional beam splitter 10 can be used to divert a portion of the laser output beam to the position sensitive sensor 11. The beam splitter can direct, for example, 0.25% to 10% of laser output beam to sensor 11.

In order to demonstrate the stabilized laser's usefulness in spectroscopy, a laser-induced-fluorescence (LIF) spectrum of $I_2$ was taken. The laser light was passed through a room temperature $I_2$ cell; the LIF was detected at 90° from the beam direction with an appropriately filtered photomultiplier tube. A portion of the laser beam was directed through a 0.5 cm$^{-1}$-FSR etalon which served as a frequency marker. This etalon is adequate to resolve a 5 GHz longitudinal-mode spacing. The LIF-frequency-marker, linear transducer, and cavity control signals were acquired at 10 Hz on a shot-by-shot basis with a computer while the laser frequency was stepped at approximately 275 MHz/shot from 659 to 647 nm.

The quality of the wavelength scan of this laser was evaluated by first calibrating the etalon frequency marks to the tabulated positions of 503 of the $I_2$ peaks across the spectrum. By linearly interpolating peak positions between etalon fringes, the $I_2$ peaks fit with an rms deviation of 330 MHz. This clearly demonstrated the continuous single-longitudinal-mode operation of the laser. The Heidenhain gauge, once calibrated to the marker etalon, was accurate to 0.1 cm$^{-1}$.

While the "un-locked" basic cavity is only capable of frequency scans of $<30$ cm$^{-1}$ (where cm$^{-1}$ represents wave numbers) without mode hopping, the present invention has the ability to scan over 200 cm$^{-1}$ by the addition of the cavity stabilization scheme of the present invention to the Littman device. The present invention is applicable to any laser cavity in which cavity-mode selection is achieved by an optical element which disperses different wavelengths into different angles.

The particular sizes and equipment discussed above are cited merely to illustrate a particular embodiment of this invention. It is contemplated that the use of the invention may involve components having different sizes and shapes as long as the principle, controlling the length of a laser cavity based on the angular deviation of a laser beam, is followed. For example, other techniques for adjusting the length of the cavity, such as heating the cavity or an intracavity element, or by tilting the laser medium or an intracavity phase plate, could be used. It is intended that the scope of the invention be defined by the claims appended hereto.

We claim:

1. A stabilization system for a tunable single longitudinal mode laser having an excited laser material contained within an adjustable length optical cavity and having an internal dispersive means, comprising:
    (a) an external sensor means fixed with respect to said internal dispersive means for sensing an angular deviation of a beam reflected from said internal dispersive means which produced said angular deviation of said reflected beam responsive to detuning between a cavity-mode frequency and a passband of said internal dispersive means, said external sensor means also capable of generating a signal responsive to said reflected beam; said external sensor means further comprising a beamsplitter to receive said reflected beam from said internal dispersive means and split said beam, a portion of said reflected beam is directed to an output, and a second portion of said reflected beam is directed to a photodetector, a photodetector to receive a portion of said reflected beam and to generate a signal responsive to said angular deviation of said reflected beam, and
    (b) control means for adjusting the length of said cavity based upon said signal.

2. The stabilization system of claim 1, wherein said sensor means is stationary with respect to said internal dispersive means.

3. The stabilization system of claim 2, wherein said sensor means detects said angular deviation by transverse motion of said second portion of said reflected beam impinging on said photodetector.

4. The stabilization system of claim 3, wherein said photodetector is a split photodiode.

5. The stabilization system of claim 1, wherein said control means is electrically connected to said photodetector and further comprises:
   (a) a piezoelectric transducer mounted on one of two mirrors within said optical cavity, said piezoelectric transducer electrically connected to a converting means, and
   (b) converting means for converting said signal to a correcting signal for application to said piezoelectric transducer to change the optical length of said cavity.

6. A stabilization system for a tunable single longitudinal mode laser having an excited laser material contained within an adjustable length optical cavity, comprising:
   (a) an internal dispersive means which produces an angular deviation of beam reflected from said internal dispersive means responsive to detuning between a cavity-mode frequency and a passband of said internal dispersive means;
   (b) a beamsplitter to receive said reflected beam from said internal dispersive means and split said reflected beam, a portion of said reflected beam is directed to an output, and a second portion of said reflected beam is directed to a split photodiode,
   (c) said split photodiode to detect said angular deviation by transverse motion of said second portion of said reflected beam impinging on said photodetector and to generate a signal responsive to said angular deviation of said reflected beam, said beamsplitter and said photodiode in an arrangement fixed in position to said internal dispersive means;
   (d) converting means electrically connected to said photodiode for converting said signal to a correcting signal; and
   (e) a piezoelectric transducer mounted on one of two mirrors within said optical cavity, said piezoelectric transducer electrically connected to said converting means, to change the optical length of said cavity responsive to said correcting signal.

7. The stabilization system of claim 6, wherein said internal dispersive means is a diffraction grating.

8. The stabilization system of claim 6, wherein said internal dispersive means is an etalon.

9. A method for stabilizing a tunable single longitudinal mode laser having an excited laser material contained within an adjustable length optical caving and producing an output laser beam reflecting from an internal dispersive means, comprising:
   (a) determining angular deviations of said output laser beam resulting from detuning between a cavity-mode frequency and a passband of said internal dispersive means by splitting the output laser beam and measuring the transverse motion of the split beam;
   (b) generating a signal based upon the angular deviations of said output laser beam; and
   (c) controlling the length of said optical cavity based upon said signal.

10. The method of claim 9, further comprising converting said signal to a correcting signal, and said step of controlling the length of said optical cavity further comprises applying said correcting signal to a piezoelectric transducer mounted on one of two mirrors within said optical cavity.

11. A method for stabilizing a tunable single longitudinal mode laser having an excited laser material contained within an adjustable length optical cavity, comprising:
   (a) reflecting a beam from an internal dispersive means;
   (b) producing an angular deviation of said reflected beam responsive to detuning between a cavity-mode frequency and a passband of said internal dispersive mean;
   (c) splitting the reflected beam having the angular deviation;
   (d) directing a portion of the split beam in a direction transverse to the angular direction;
   (e) sensing the angular deviation of the reflected and split beam at a direction transverse to the angular deviation;
   (f) generating a signal responsive to the split and reflected beam transverse to the angular deviation;
   (g) applying the signal to a piezoelectric transducer mounted on one of two mirrors mounted within the optical cavity;
   (k) moving the mirror to which the piezoelectric transducer is mounted to correct the optical length of the cavity.

* * * * *